US008525019B2

(12) United States Patent
Frey et al.

(10) Patent No.: US 8,525,019 B2
(45) Date of Patent: Sep. 3, 2013

(54) THIN FILM ARTICLE AND METHOD FOR FORMING A REDUCED CONDUCTIVE AREA IN TRANSPARENT CONDUCTIVE FILMS FOR PHOTOVOLTAIC MODULES

(75) Inventors: Jonathan Mack Frey, Denver, CO (US); Scott Daniel Feldman-Peabody, Golden, CO (US)

(73) Assignee: Primestar Solar, Inc., Arvada, CO (US)

( * ) Notice: Subject to any disclaimer, the term of this patent is extended or adjusted under 35 U.S.C. 154(b) by 539 days.

(21) Appl. No.: 12/828,408

(22) Filed: Jul. 1, 2010

(65) Prior Publication Data

US 2012/0000520 A1     Jan. 5, 2012

(51) Int. Cl.
| | | |
|---|---|---|
| H01L 31/00 | (2006.01) |
| H01L 31/02 | (2006.01) |
| H01L 31/18 | (2006.01) |
| H01L 21/00 | (2006.01) |
| H01L 21/329 | (2006.01) |
| H01L 21/428 | (2006.01) |
| H01L 21/268 | (2006.01) |

(52) U.S. Cl.
USPC ............ 136/256; 136/252; 438/34; 438/73; 438/98; 438/458; 438/460; 438/462; 438/487; 257/53; 257/257; 257/E31.126

(58) Field of Classification Search
USPC ........................................................ 136/256
See application file for complete search history.

(56) References Cited

U.S. PATENT DOCUMENTS

| | | | |
|---|---|---|---|
| 4,104,084 A | 8/1978 | Evans, Jr. | |
| 4,135,290 A | 1/1979 | Evans, Jr. | |
| 4,500,567 A * | 2/1985 | Kato et al. | 427/255.35 |
| 4,700,463 A * | 10/1987 | Hama | 438/7 |
| 4,732,621 A | 3/1988 | Murata et al. | |
| 4,734,381 A * | 3/1988 | Mitchell | 438/95 |
| 4,754,544 A | 7/1988 | Hanak | |
| 4,824,488 A * | 4/1989 | Sakai et al. | 136/244 |
| 5,164,855 A | 11/1992 | Buffat et al. | |
| 5,176,758 A | 1/1993 | Nath et al. | |
| 5,221,854 A | 6/1993 | Banerjee et al. | |
| 5,397,920 A | 3/1995 | Tran | |
| 5,413,959 A | 5/1995 | Yamamoto et al. | |
| 6,077,722 A | 6/2000 | Jansen et al. | |
| 6,121,541 A | 9/2000 | Arya | |

(Continued)

FOREIGN PATENT DOCUMENTS

| | | |
|---|---|---|
| WO | WO 2004/006293 | 1/2004 |
| WO | WO 2009/058385 | 5/2009 |

OTHER PUBLICATIONS

Yoshimichi et al., JP 10139428, English machine translation, May 1998, Japan, pp. 1-8.*

(Continued)

Primary Examiner — Jeffrey T Barton
Assistant Examiner — Tae-Sik Kang
(74) Attorney, Agent, or Firm — Dority & Manning, P.A.

(57) ABSTRACT

A method for forming a reduced conductive area in transparent conductive. The method includes providing a transparent, electrically conductive, chemically reducible material. A reducing atmosphere is provided and concentrated electromagnetic energy from an energy source is directed toward a portion of the transparent, electrically conductive, chemically reducible material to form a reduced conductive area. The reduced conductive area has greater electrical conductivity than the transparent, electrically conductive, chemically reducible material. A thin film article and photovoltaic module are also disclosed.

14 Claims, 9 Drawing Sheets

(56) References Cited

U.S. PATENT DOCUMENTS

| | | | |
|---|---|---|---|
| 6,137,048 | A | 10/2000 | Wu et al. |
| 6,169,246 | B1 | 1/2001 | Wu et al. |
| 6,261,694 | B1 | 7/2001 | Iacovangelo |
| 6,288,325 | B1 | 9/2001 | Jansen et al. |
| 6,365,016 | B1 | 4/2002 | Iacovangelo et al. |
| 6,368,892 | B1 | 4/2002 | Arya |
| 6,420,032 | B1 | 7/2002 | Iacovangelo |
| 6,426,125 | B1 | 7/2002 | Yang et al. |
| 6,517,687 | B1 | 2/2003 | Iacovangelo |
| 6,548,751 | B2 | 4/2003 | Sverdrup, Jr. et al. |
| 6,706,962 | B2 | 3/2004 | Nelles et al. |
| 6,737,121 | B2 | 5/2004 | Yang et al. |
| 6,878,974 | B2 | 4/2005 | Heeger et al. |
| 6,908,782 | B2 | 6/2005 | Yan et al. |
| 6,933,009 | B2 | 8/2005 | Ueda et al. |
| 6,936,761 | B2 | 8/2005 | Pichler |
| 6,996,150 | B1 | 2/2006 | Shakuda |
| 7,141,863 | B1 | 11/2006 | Compaan et al. |
| 7,179,527 | B2 | 2/2007 | Sato et al. |
| 7,193,763 | B2 | 3/2007 | Beteille et al. |
| 7,211,462 | B2 | 5/2007 | Romeo et al. |
| 7,259,322 | B2 | 8/2007 | Gronet |
| 7,276,658 | B2 | 10/2007 | Dubbeldam |
| 7,364,808 | B2 | 4/2008 | Sato et al. |
| 7,368,655 | B2 | 5/2008 | Blieske et al. |
| 7,390,731 | B2 | 6/2008 | Kroll et al. |
| 7,394,016 | B2 | 7/2008 | Gronet |
| 7,544,884 | B2 | 6/2009 | Hollars |
| 7,582,161 | B2 | 9/2009 | Ahn et al. |
| 2003/0213974 | A1* | 11/2003 | Armstrong et al. ............ 257/184 |
| 2008/0105303 | A1 | 5/2008 | Oswald et al. |
| 2008/0136604 | A1* | 6/2008 | Kozuma et al. ............. 340/10.51 |
| 2009/0258205 | A1* | 10/2009 | Seto et al. ...................... 428/216 |
| 2009/0302314 | A1 | 12/2009 | Kusumori et al. |

OTHER PUBLICATIONS

Merriam-Webster Learners Dictionary, 'electromagnetic radiation' [online], [retrieved on Oct. 31, 2012]. Retrieved from the Internet<URL: http://www.merriam-webster.com/dictionary/electromagnetic%20radiation>, pp. 1-2.*

Article—"Highly Textured and Conductive Undoped ZNO Film Using Hydrogen Post-Treatment", Baik et al., Applied Physics Letters, AIP, Melville, NY, vol. 70, No. 26, Jun. 30, 1997, pp. 3516-3518.

EPO Search Report, Dec. 6, 2011.

* cited by examiner

THIN FILM ARTICLE AND METHOD FOR FORMING A REDUCED CONDUCTIVE AREA IN TRANSPARENT CONDUCTIVE FILMS FOR PHOTOVOLTAIC MODULES

FIELD OF THE INVENTION

The present invention is directed to thin film articles having transparent conductive films and methods for modifying transparent conductive films.

BACKGROUND OF THE INVENTION

Energy demand is constantly increasing. As the energy demand increases, sources alternative to fossil fuel energy sources increase in importance. One such alternative energy source is solar energy. Generally, solar energy is produced by converting radiation (for example, sunlight) into electricity which may be stored or transmitted through electrical power grids.

Transparent conductive oxides (TCOs) are used as electrically conductive layers for the electrical contact of thin film photovoltaic (PV) cells in a PV module on a side that receives sunlight during operation. During processing, interconnections between cells are provided using thin film application methods and scribing techniques, using chemicals or lasers to selectively remove material. As a result of the processing and the structures forming the interconnections, the area of interconnection between cells is a "dead area" (i.e., no light collection) and does not generate electricity.

In addition, the interconnection between conductive layers is a large contributor to series resistance in a PV module. Therefore, it is desirable to decrease the resistivity of the area of interconnections between PV cells.

A method for producing an article that has decreased resistivity/increased conductivity in the interconnection between cells, without affecting the active area of the PV cells would be desirable.

BRIEF DESCRIPTION OF THE INVENTION

One aspect of the present disclosure includes a method for forming a reduced conductive area in transparent conductive films. The method includes providing a transparent, electrically conductive, chemically reducible material. A reducing atmosphere is providing and concentrated electromagnetic energy from an energy source is directed toward a portion of the transparent electrically conductive, chemically reducible material to form a reduced conductive area. The reduced conductive area has greater electrical conductivity than the transparent, electrically conductive, chemically reducible material.

Another aspect of the present disclosure includes a thin film article having selectively modified electrical conductivity. The article includes a substrate having a transparent, electrically conductive, chemically reducible material and a reduced conductive area selectively disposed within the electrically conductive, chemically reducible material. The reduced conductive area has greater electrical conductivity than the transparent, electrically conductive, chemically reducible material.

Still another aspect of the present disclosure includes a thin film photovoltaic module having a transparent conductive oxide layer. The module includes a reduced conductive area selectively disposed within the transparent conductive oxide layer. The reduced conductive area has greater electrical conductivity than the transparent conductive oxide layer.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided is a method for producing an article that has decreased resistivity/increased conductivity in the interconnection between cells, without substantially affecting the active area of the PV cells. Embodiments of the present disclosure may result in articles having decreased resistivity in the interconnection area between cells and increased overall module efficiency. In addition, other embodiments may permit the laser scribing of the interconnection in a controlled environment during interconnection formation in the presence of a readily available oxygen-reducing gas such as forming gas or carbon monoxide, which decreases the series resistance of the module. The system and method of the present disclosure may increase the PV module efficiency, without complicated or expensive equipment or processes.

In the disclosure, when a layer is being described as "adjacent", "on" or "over" another layer or substrate, it is to be understood that the layer can either be directly in contact or that another layer or feature can intervene. In addition, "dead area" includes an area across the PV module that does not produce electricity when exposed to light. For example a dead area may include an area having no material that produces electricity or may include electricity producing layers that are electrically isolated. Conversely, "active area" includes an area across the PV module that produces electricity when exposed to light and is connectable to a load. When a layer or material is described as "transparent", it is to be understood that a transparent film includes materials that are fully or partially transparent to light at some or all wavelengths found in natural sunlight. When a layer or material is described as "electrically conductive" or "conductive" or is a "conductor" it is to be understood that the material permits the flow of electricity with or without electrical resistance. When a layer or material is described as "electrically insulative", "insulative" or is an "insulator" it is to be understood that the material impedes or prevents the flow of electricity. "Reduced", "reducing", "reduction" and other grammatical variations thereof refer to chemical reduction of a material wherein a gain of electrons or a decrease in oxidation state by a molecule, atom or ion takes place. In particular, reduction may include the chemical removal of oxygen from an oxide to form a metallic or partially metallic material. "Modifying", "modify" and other grammatical variations thereof with respect to layers, articles and materials refer to a change, such as a chemical change, in the material resulting in properties that are different than the original material.

One embodiment of the disclosure includes a method for converting a transparent conductive layer, typically a transparent conductive oxide layer (TCO), in the dead area of a PV module to a higher conductivity metal. The conversion process may include a chemical reduction process that removes oxygen from the TCO. The method through which the TCO is converted is through the alleviation of oxygen in the films when heated by laser in the presence of an oxygen-attracting gas such as hydrogen, forming gas or carbon monoxide.

Figure 1:
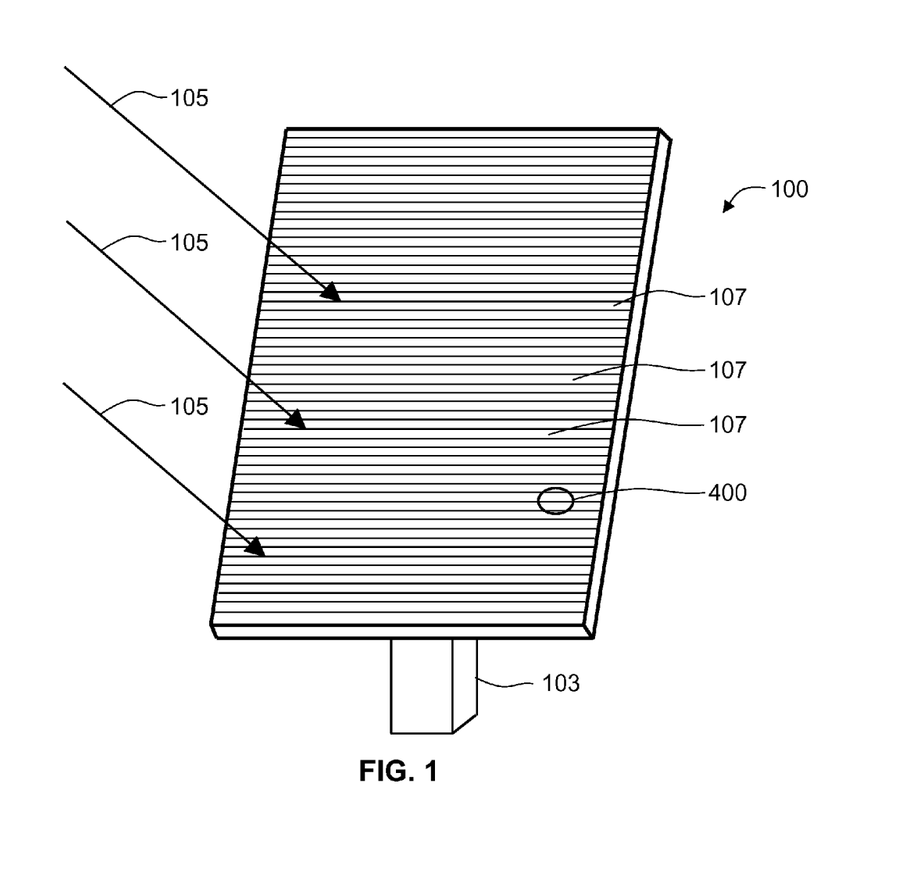
FIG. 1 shows a thin film module mounted on a base according to the disclosure.

FIG. 1 shows a thin film PV module 100 mounted on a base 103. The PV module is arranged to receive light 105. The PV module is divided into a plurality of cells 107 that are arranged in series. The cells 107 are divided by spaces, non-conductive material and/or other structures separating circuits. For example, cells 107 may be isolated from each other by scribes formed by laser scribing. When the PV module 100 is exposed to light 105, electricity is produced. The disclosure is not limited to the arrangement shown and may include other mounting arrangements and/or cells 107. For example, the cells 107 may be oriented along the long dimension of module 100 instead of the short dimension of module 100. One embodiment of the disclosure includes a thin film CdTe solar photovoltaic (PV) module. Such modules are used to produce solar electricity for numerous applications, for example, large ground-mounted systems and rooftop systems on commercial and residential buildings. While the PV module may be a thin film structure, the method and system of the present disclosure may also be utilized to form gridline front contacts on crystalline solar cells such as, Si or Group III-V-based concentrators (e.g., GaAs, and GaInP).

Figure 2:
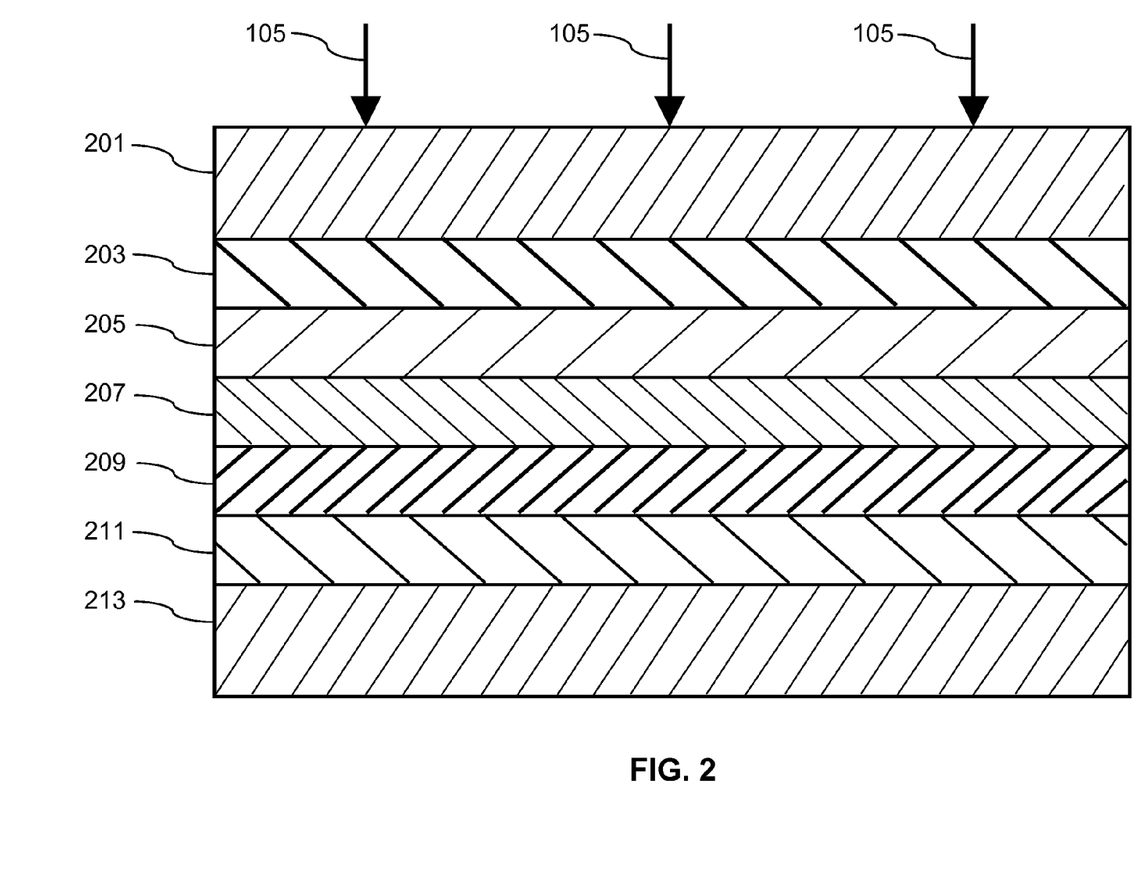
FIG. 2 is a diagram of a layer system making up cells of a module according to the disclosure.

FIG. 2 is a diagram of the layer system forming cells 107 of PV module 100. The layers of cell 107 include a superstrate 201, a first conductive layer 203, a buffer layer 205, a first semiconductor layer 207, a second semiconductor layer 209, a second conductive layer 211 and an encapsulating glass 213. The layers of the cell 107 are arranged to generate and conduct electricity in a usable form when exposed to light 105.

The superstrate 201 is a sheet of high transmission glass onto which thin films are grown. The superstrate receives the light 105 (see FIG. 1) prior to the underlying layers. Superstrate 201 may be standard soda-lime glass, a high-transmission, low-iron float glass or any other suitable glass material having a high transmission rate for light 105. In another embodiment, the superstrate 201 may also be a high transmission borosilicate glass.

After the light 105 passes through superstrate 201, at least a portion of the light 105 passes through first conductive layer 203. First conductive layer 203 may be a transparent conductive oxide (TCO), which permits transmission of light 105 with little or no absorption. The first conductive layer 203 is also electrically conductive, which permits electrical conduction to provide the series arrangement of cells. The first conductive layer 203 is formed to a thickness that provides electrical conductivity, but permits the passage of at least some light 105. While not so limited, in one embodiment, the first conductive layer 203 may be formed to a thickness of about 0.1-0.7 µm or 0.1-0.4 µm or 0.2-0.3 µm or 0.2-1.0 µm or 0.3-0.7 µm or 0.35-0.55 µm of tin oxide. One suitable material for use in formation of the first conductive layer 203 may be fluorine-doped tin oxide.

Other suitable conductive layers may include, for example, stoichiometric cadmium stannate (nominally $Cd_2SnO_4$), aluminum-doped zinc oxide, indium tin oxide, doped indium oxide, zinc or cadmium doped tin oxide, copper aluminum oxides or another compound of cadmium tin oxide (such as $CdSnO_3$). First conductive layer 203 may permit passage of light 105 through to the semiconductor layers (e.g., first semiconductor layer 207 and second semiconductor layer 209) while also functioning as an ohmic electrode to transport photogenerated charge carriers away from the light absorbing material.

A buffer layer 205 is adjacent to first conductive layer 203. Buffer layer 205 is more electrically resistive and protects the layers of cell 107 from chemical interactions from the glass and/or interactions which might be incurred from subsequent processing. Inclusion of buffer layer 205 reduces or prevents electrical or other losses that may take place across cell 107 and across module 100. Suitable materials for buffer layer 205 may include tin oxide containing materials, such as, but not limited to, zinc doped tin oxide, a mixture of zinc and tin oxides (for example zinc tin oxide having 0.5 to 33 atomic % Zn), zinc stannate, gallium oxide, aluminum oxide, silicon oxide, indium oxide, cadmium oxide and any other suitable barrier material having more electrical resistivity than first conductive layer 203 and the capability of protecting the layers of the cell from interactions from the glass or interactions from subsequent processing. In addition, the inclusion of buffer layer 205 permits the formation of a first semiconductor layer 207 which permits photon passage while maintaining a high quality junction capable of generating electricity. In certain embodiments, buffer layer 205 may be omitted or substituted by another material or layer. In one embodiment, buffer layer 205 includes a combination of ZnO and $SnO_2$. For example, in one embodiment, the buffer layer 205, while not so limited, may be formed to a thickness of up to about 1.5 microns or about 0.8-1.5 microns and may include ZnO and $SnO_2$ having about 1 to 22 wt % Zn and Zn to Sn ratios from about 1:60 to 1:2 or from about 1:5 to about 1:18 or about 1:10. Other suitable Zn to Sn ratios may include 0:1 to 1:2 or about 0:0.5.

As shown in FIG. 2, first semiconductor layer 207 is adjacent to buffer layer 205 and receives light 105 subsequent to superstrate 201, first conductive layer 203 and buffer layer 205. First semiconductor layer 207 includes a wide bandgap n-type semiconductor material. Suitable semiconductor material for first semiconductor layer 207 includes, but is not limited to CdS, $SnO_2$, CdO, ZnO, AnSe, GaN, $In_2O_2$, CdSnO, ZnS, CdZnS or other suitable n-type semiconductor material. In one embodiment the first semiconductor layer 207 includes CdS. While not so limited, first semiconductor layer 207 may have a thickness from about 0.01 to about 0.12 µm or 0.03 to 0.1 µm or 0.05 to 0.9 µm or about 0.08 µm. First semiconductor layer 207 may be formed by chemical bath deposition or by sputtering. First semiconductor layer 207 preferably has a smooth surface and is substantially uniform and free of impurities and pinholes.

First semiconductor layer 207 forms the junction with a second semiconductor layer 209 to create the photovoltaic effect in cell 107, allowing electricity to be generated from light 105. Second semiconductor layer 209 may include, for example, Cd, CdTe or other p-type semiconductor material. When second semiconductor layer 209 is provided with first semiconductor layer 207 a photovoltaic effect results when exposed to light 105.

As shown in FIG. 2, second semiconductor layer 209 is adjacent to first semiconductor layer 207. A second conductive layer 211 is adjacent to the second semiconductor layer 209 and provides an electrically conductive material that is capable of conducting electricity formed from the combination of the first semiconductor layer 207 and second semiconductor layer 209 when exposed to light 105. Although FIG. 2 shows an arrangement of two layers for first semiconductor layer 207 and second semiconductor layer 209, any number of layers, including interfacial layers, may be utilized to provide the photovoltaic effect.

Second conductive layer 211 may be fabricated from any suitable conductive material and combinations thereof. For example, suitable materials may include materials including, but not limited to, graphite, metallic silver, nickel, copper, aluminum, titanium, palladium, chrome, molybdenum alloys of metallic silver, nickel, copper, aluminum, titanium, palladium, chrome, and molybdenum and any combination thereof. In one embodiment, second conductive layer 209 may be a combination of graphite, nickel and aluminum alloys.

An encapsulating glass 213 may be adhered adjacent to second conductive layer 211. Encapsulating glass 213 may be a rigid structure suitable for use with the thin films of cell 107. Encapsulating glass 213 may be the same material as superstrate 201 or may be different. In addition, although not shown in FIG. 2, encapsulating glass 213 may include openings or structures to permit wiring and/or connection to cell 107.

Module 100 and individual cells 107 may include other layers and structures not shown in FIG. 2. For example, superstrate 201 and/or encapsulating glass 213 may include a barrier coating or other structure in order to reduce or prevent diffusion of impurities into the layers. In addition, encapsulating glass 213 may include an adherent layer to adhere encapsulating glass 213 to the layers. Additional structures that may be present in module 100 and/or cells 107 include, for example, scribes, bussing structures, external wiring, and various conventional components useful with thin film and/or PV structures.

Figure 3:
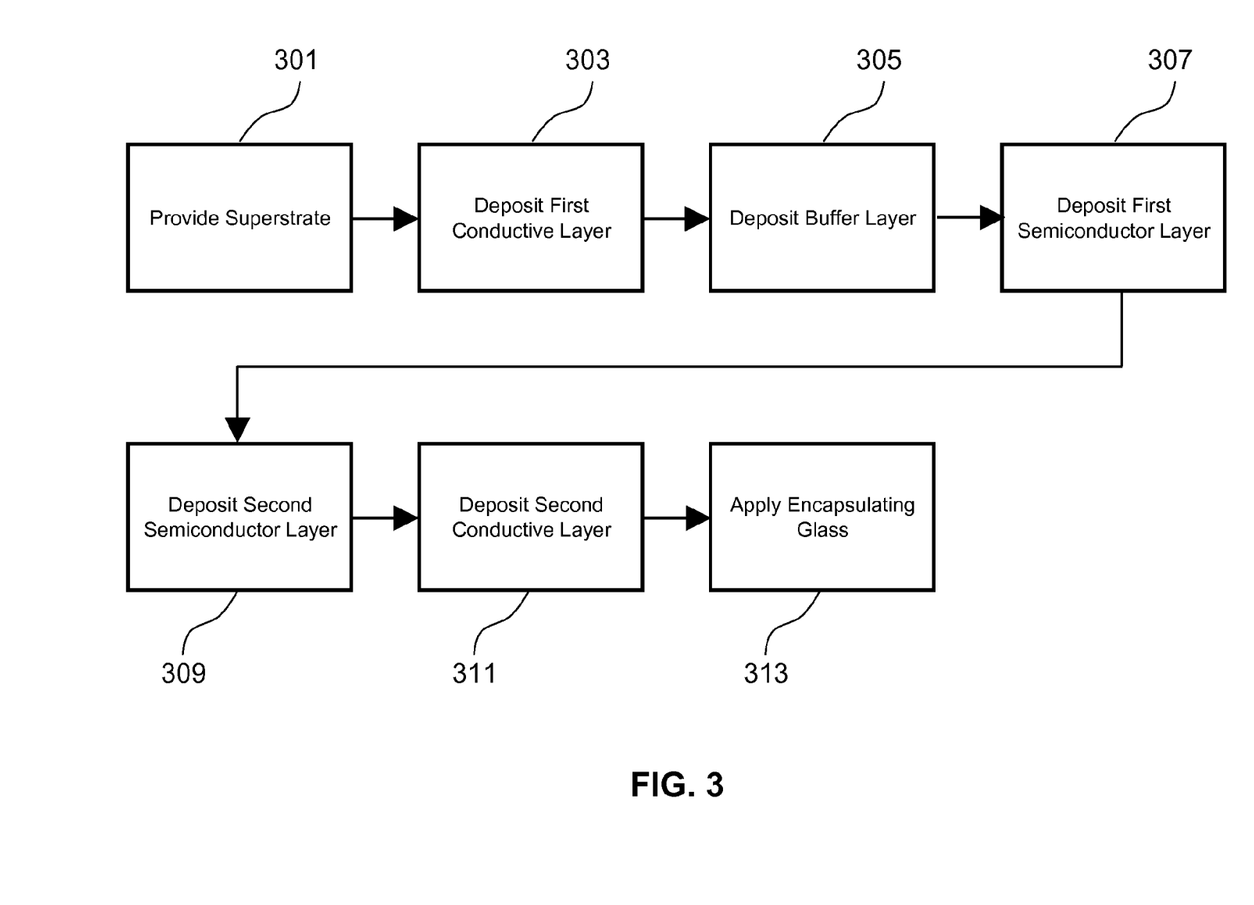
FIG. 3 is a process flow diagram for an exemplary process for forming a module according to the disclosure.

FIG. 3 shows a process flow diagram for an exemplary process for forming module 100. The process includes the formation of a thin film stack forming cell 107, wherein the films or layers are formed on superstrate 201 (shown from the top down in FIG. 2).

As shown in the flow diagram of FIG. 3, superstrate 201 is provided (box 301). Superstrate 201 may be fabricated from any suitable material capable of receiving thin films for use as photovoltaic cells and sufficiently transparent to allow transmission of light 105.

Subsequent to providing superstrate 201, first conductive layer 203 is deposited onto superstrate 201 (box 303). First conductive layer 203 is electrically conductive, which permits electrical conduction to provide the series arrangement of cells 107. While not so limited, in one embodiment, first conductive layer 203 may be formed to a thickness of about 0.1-0.7 µm or 0.1-0.4 µm or 0.2-0.3 µm or 0.2-1.0 µm or 0.3-0.7 µm or 0.35-0.55 µm of tin oxide. Other suitable conductive layers may include fluorine-doped stoichiometric cadmium stannate (nominally $Cd_2SnO_4$), aluminum-doped zinc oxide, indium tin oxide, doped indium oxide, zinc or cadmium doped tin oxide, copper aluminum oxides or another compound of cadmium tin oxide (such as $CdSnO_3$). First conductive layer 203 can be formed, for example, by direct current (DC) or radio frequency (RF) sputtering. In one embodiment, first conductive layer 203 is a layer of tin oxide substantially amorphous $Cd_2SnO_4$ that is deposited with chemical vapor deposition (CVD) onto superstrate 201. Such CVD can be performed from tin and fluorine containing precursors in an oxygen containing environment.

Once first conductive layer 203 is applied, buffer layer 205 may be applied to first conductive layer 203 (box 305). In one embodiment, buffer layer 205 may be formed, for example, by sputtering. In one example, buffer layer 205 may be formed by sputtering from a hot-pressed target containing, for example, primarily Sn and 1-22% Zn by weight or stoichiometric amounts of about 67 mol % $SnO_2$ and about 33 mol % ZnO onto first conductive layer 203. When deposited by sputtering, the zinc tin oxide material for buffer layer 205 may be substantially amorphous. Buffer layer 205 may have a thickness of between about 200 and 3,000 Angstroms, or between about 800 and 1,500 Angstroms, in order to have desirable mechanical, optical, and electrical properties. Buffer layer 205 may have a wide optical bandgap, for example about 3.3 eV or more, in order to permit the transmission of light 105.

First semiconductor layer 207 is deposited on buffer layer 205 (box 307). In one embodiment, first semiconductor layer 207 may be formed, for example, by chemical bath deposition or sputtering. While not so limited, first semiconductor layer 207 may be deposited to a thickness of from about 0.01 to about 0.3 µm or about 0.01 to about 0.12 µm or 0.03 to 0.1 µm or 0.05 to 0.9 µm or about 0.08 µm. One suitable material for use as first semiconductor layer 207 may include CdS. A suitable thickness for a CdS layer may range from about 500 to 800 Angstroms. First semiconductor layer 207 forms the junction with second semiconductor layer 209 to create the photovoltaic effect in cell 107, allowing cell 107 to produce electricity from light 105.

After the formation of first semiconductor layer 207, second semiconductor layer 209 is deposited on first semiconductor layer 207 (box 309). Second semiconductor layer 209 may include Cd, CdTe or other p-type semiconductor material. Second semiconductor layer 209 may be deposited by diffusive transport deposit, sputtering or other suitable deposition method for depositing p-type semiconductor thin film material.

Subsequent to the formation of the second semiconductor layer 209, second conductive layer 211 is formed (box 311). Second conductive layer 211 may be fabricated from any suitable conductive material. Second conductive layer 211 may be formed by sputtering, electrodeposition, screen printing, physical vapor deposition (PVD), chemical vapor deposition (CVD) or spraying. In one embodiment, second conductive layer 211 is a combination of graphite that is screen printed onto the surface and nickel and aluminum alloy that is sputtered thereon.

All the sputtering steps described above may be magnetron sputtering at ambient temperature under highly pure atmospheres. For example, a zinc tin oxide buffer layer 205 may be formed by DC sputtering. However, other deposition processes may be used, including higher temperature sputtering, electrodeposition, screen printing, physical vapor deposition (PVD), chemical vapor deposition (CVD) or spraying. In addition, the processing may be provided in a continuous line or may be a series of batch operations. When the process is a continuous process, the sputtering or deposition chambers are individually isolated and brought to coating conditions during each coating cycle, then repeated.

Once second conductive layer 211 is formed, encapsulating glass 213 is adhered to second conductive layer 211 (box 313). Encapsulating glass 213 may be a rigid material suitable for use with thin film structures and may be the same material or different material than superstate 201. Encapsulating glass 213 may be adhered to second conductive layer 211 using any suitable method. For example, encapsulating glass 213 may be adhered to second conductive layer 211 using an adhesive or other bonding composition.

Although not shown in FIG. 3, other processing steps may be included in the process for forming module 100 and cells 107. For example, cleaning, etching, doping, dielectric or other selective insulative material deposition, formation of interfacial layers, scribing, heat treatments, and wiring may also be utilized. For example, wiring and/or bussing devices may be provided to complete the PV circuit (i.e., cells 107 in series arrangement) and to provide connectivity of the PV circuit to a load or other external device.

Scribing may be utilized to form the interconnections between the layers and to isolate cells and/or layers of the thin film stack. Scribing may be accomplished using any known technique for scribing and/or interconnecting the thin film layers. In one embodiment, scribing is accomplished using a laser directed at one or more layers from one or more directions. One or more laser scribes may be utilized to selectively remove thin film layers and to provide interconnectivity and/or isolation of cells 107. In one embodiment, the scribes and layer deposition are accomplished to interconnect and/or isolate cells 107 to provide a PV circuit having cells 107 in a series of electrical arrangements.

Figure 4:
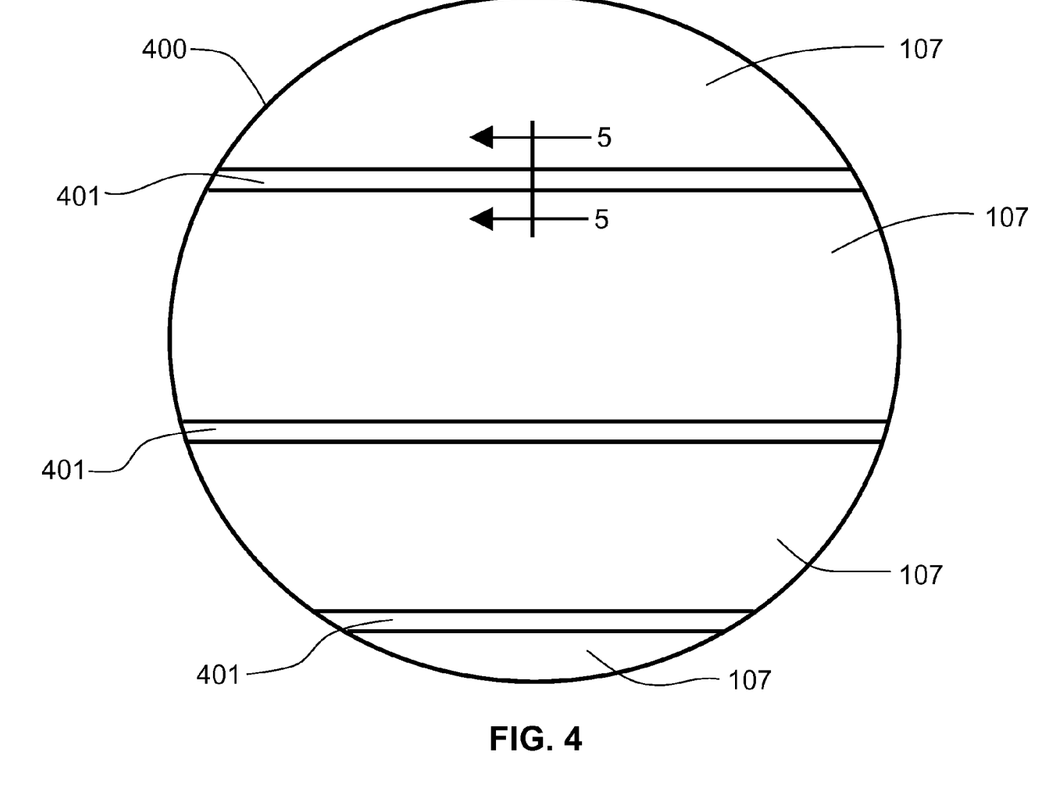
FIG. 4 shows an enlarged area 400 of the thin film module of FIG. 1.

FIG. 4 shows an enlarged area 400 from FIG. 1. As shown in FIG. 4, cells are divided by interconnections 401. The interconnections 401 may be any suitable structures for forming the electrical interconnection between cells 107. Suitable structures may include spacing or scribes, dielectric material, insulating material, wiring, conductive material or other suitable material for forming the electrical connection between cells 107.

Figure 5:
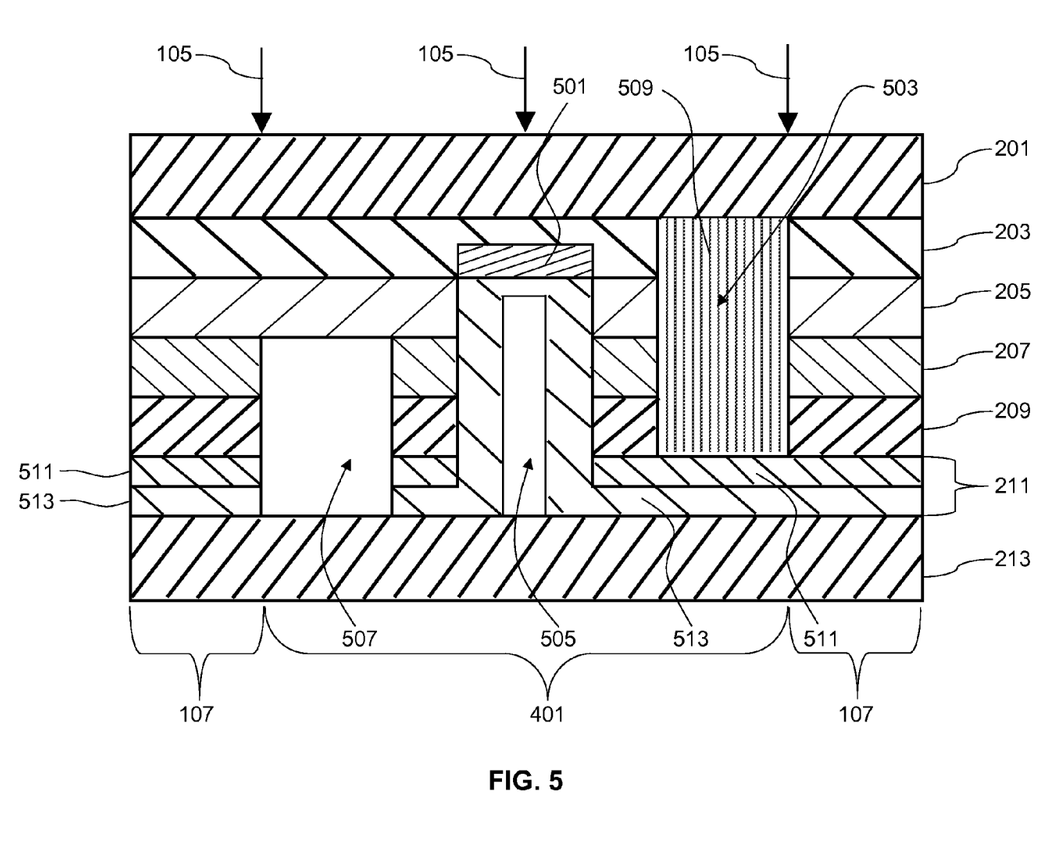
FIG. 5 shows a sectional view taken in direction 5-5 of FIG. 4.

FIG. 5 illustrates a side view of an exemplary film stack for interconnection 401 taken in direction 5-5 of FIG. 4. As shown in FIG. 5, the interconnection 401 includes structures formed between cells 107. As shown in FIG. 5, the interconnection 401 includes a first scribe 503, a second scribe 505 and a third scribe 507. First scribe 503, second scribe 505 and third scribe 507 of interconnection 401 are formed during the formation of the cell 107 (see method of FIG. 3).

Figure 6:
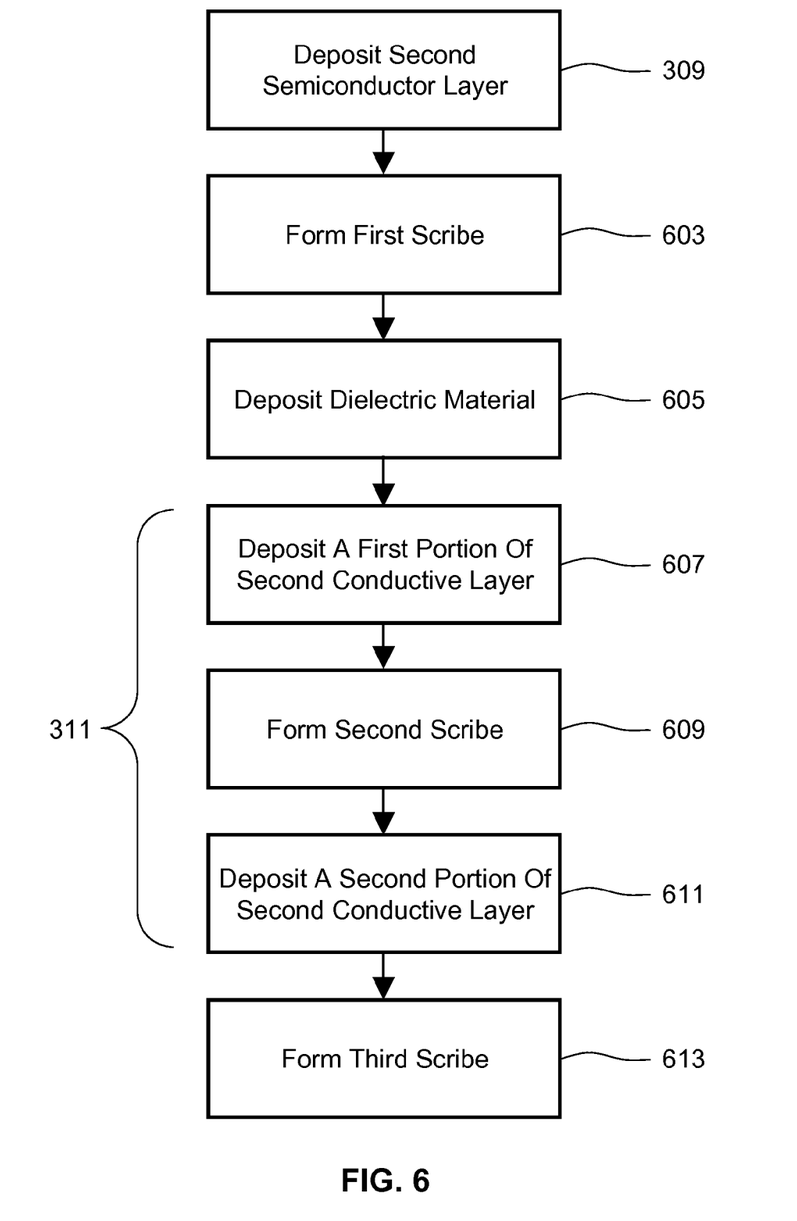
FIG. 6 is a process flow diagram for an exemplary process for forming an interconnection according to the disclosure.

FIG. 6 includes a flowchart illustrating an exemplary method for forming interconnection 401. The method includes depositing second semiconductor layer 209 (box 309), as shown and described with respect to box 309 of FIG. 3. Specifically, first scribe 503 is formed subsequent to the deposition of the second semiconductor layer (box 603) and may be formed by directing an energy source, for example in the form of concentrated electromagnetic energy, or a beam through superstrate 201 to selectively remove the layers present thereon. Suitable energy sources may include, but are not limited to, laser, radio frequency (Rf), electron beam, ion beam, infrared (IR) or source for rapid thermal process (RTA). In another embodiment, the scribe may be formed by chemical processes, such as photolithography. To provide electrical isolation, the first scribe 503 is filled with dielectric material 509 (box 605). Suitable dielectric materials may include, but are not limited to a negative photo resist or other suitable dielectric material.

The method for forming interconnection 401 further includes formation of the second scribe 505 during the deposition of the second conductive layer 211 (box 609 of FIG. 6, box 311 of FIG. 3). This step includes depositing a first portion 511 of second conductive layer 211. This first portion 511 may include any suitable conductive material. Suitable first portion 511 may include, for example, graphite. After the first portion 511 is formed, the second scribe 505 may be formed by directing concentrated electromagnetic energy or a beam from an energy source through superstrate 201 to selectively remove the layers present thereon (box 609). The energy source may be any suitable energy source and may include the same or different source utilized to form first scribe 503. Subsequent to formation of second scribe 505, a second portion 513 of the second conductive layer 211 is provided (box 611). The second portion 513 may be any suitable conductive material and may include, for example, metal alloys, such as Ni and Al containing alloys. For example, in one embodiment a first portion 511 containing a graphite layer is provided prior to the second scribe 505 and a second portion 513 a metal layer is provided after the second scribe 505 is formed. In addition to providing the second portion 513 to the cell 107, the second portion 513 is also deposited onto surfaces formed by the second scribe 505. Since the second portion 513 of the second conductive layer 211 is electrically conductive, the second portion electrically connects the first conductive layer 203 and buffer layer 205 to the second conductive layer 211. This connection (upon isolation with the third scribe 507, see below) places the cells 107 into a series arrangement.

The third scribe 507 is formed subsequent to the deposition of the second conductive layer 211 (box 613). The third scribe 507 may be formed by directing concentrated electromagnetic energy from an energy source onto the layers from the direction opposite the superstrate 201 to selectively remove the layers present thereon. The energy source may be any suitable energy source and may include the same or different source utilized to form first scribe 503. Third scribe 507 severs the first conductive layer 211, the first semiconductor layer 207 and the second semiconductor layer 209, but permits the buffer layer 205 and the first conductive layer 203 to remain (see e.g., FIG. 5). The arrangement of the module 100 remaining after the third scribe 507 is a series arrangement of cells 107.

The second scribe 505 formed after the deposition of the first portion 511 of the second conductive layer 211 (see e.g., box 609 in FIG. 6) results in a space that extends to the first conductive layer 203 (see e.g., FIG. 5). In one embodiment of the present disclosure, reduced conductive area 501 is formed on the first conductive layer 203. The reduced conductive area 501 is an area in which the material of the first conductive layer 203 is at least partially chemically reduced. The reduced conductive area 501 may be located along the first conductive layer 203. The positioning of the reduced conductive area 501 may be such that the reduced conductive area 501 occupies the dead areas of module 100 that do not generate electricity, wherein any opacity or lack of transparency in the reduced conductive area 501 does not affect the performance of the module 100. In addition, the increased conductivity or reduced resistivity of the first conductive layer 203 in the area of the reduced conductive area 501 increases the efficiency and/or performance of the module 100.

Figure 7:
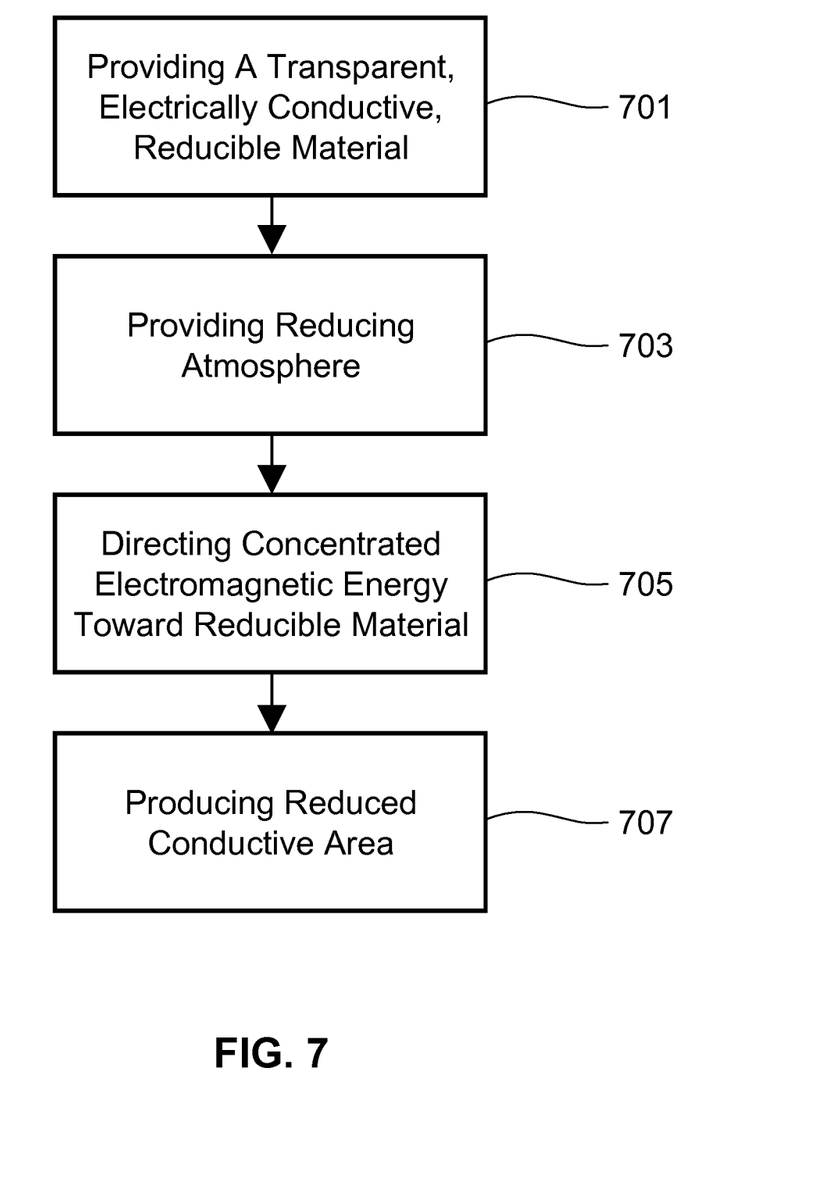
FIG. 7 is a process flow diagram for an exemplary process for forming a reduced conductive area.

FIG. 7 includes a flowchart illustrating an exemplary method for forming reduced conductive area 501. The method includes providing a transparent, electrically conductive, reducible material (box 701). The reducible material may, for example, be a first conductive layer 203 including transparent conductive oxide (TCO) material. Suitable reducible material may include $SnO_2$, $In_2O_3$, $Cd_2SnO_4$, ZnO, other reducible material and combinations thereof. The method further includes providing a reducing atmosphere (box 703). The reducing atmosphere may include gas such as, for example, hydrogen, carbon monoxide, reforming gas or other suitable reducing gas. An exemplary reducing atmosphere may include a combination of carbon monoxide and forming gas (4-5% $H_2$, 95-96% $N_2$) ambient gas composition. In another embodiment, the reducing atmosphere may include a gas additive to provide desirable material properties in the formed reduced conductive area 501. In this embodiment, the reduced conductive area 501 may include reduced gas additive. In one embodiment, the gas additive is provided to reduce or eliminate the amount of volume change that may result from the reduction or exposure to heat. Suitable gas additives may include organometallic gasses such as tin tetrachloride, dimethyl cadmium, dimethyl zinc or combinations thereof. An energy source, such as a laser, is directed toward the reducible material in the form of concentrated electromagnetic energy (box 705). The laser or other energy source is configured to generate concentrated electromagnetic energy with a power density and/or wavelength that provides heat and energy to the reducible material. The reduced conductive area 501 where concentrated electromagnetic energy 803 from the energy source 801 (see e.g., FIG. 8) contacts the reducible material in the reducing atmosphere includes conditions that facilitate reduction of the reducible material to form the reduced conductive area 501 (box 707). The reduced conductive area 501 includes an electrical conductivity that is greater than the conductivity of the reducible material.

Figure 8:
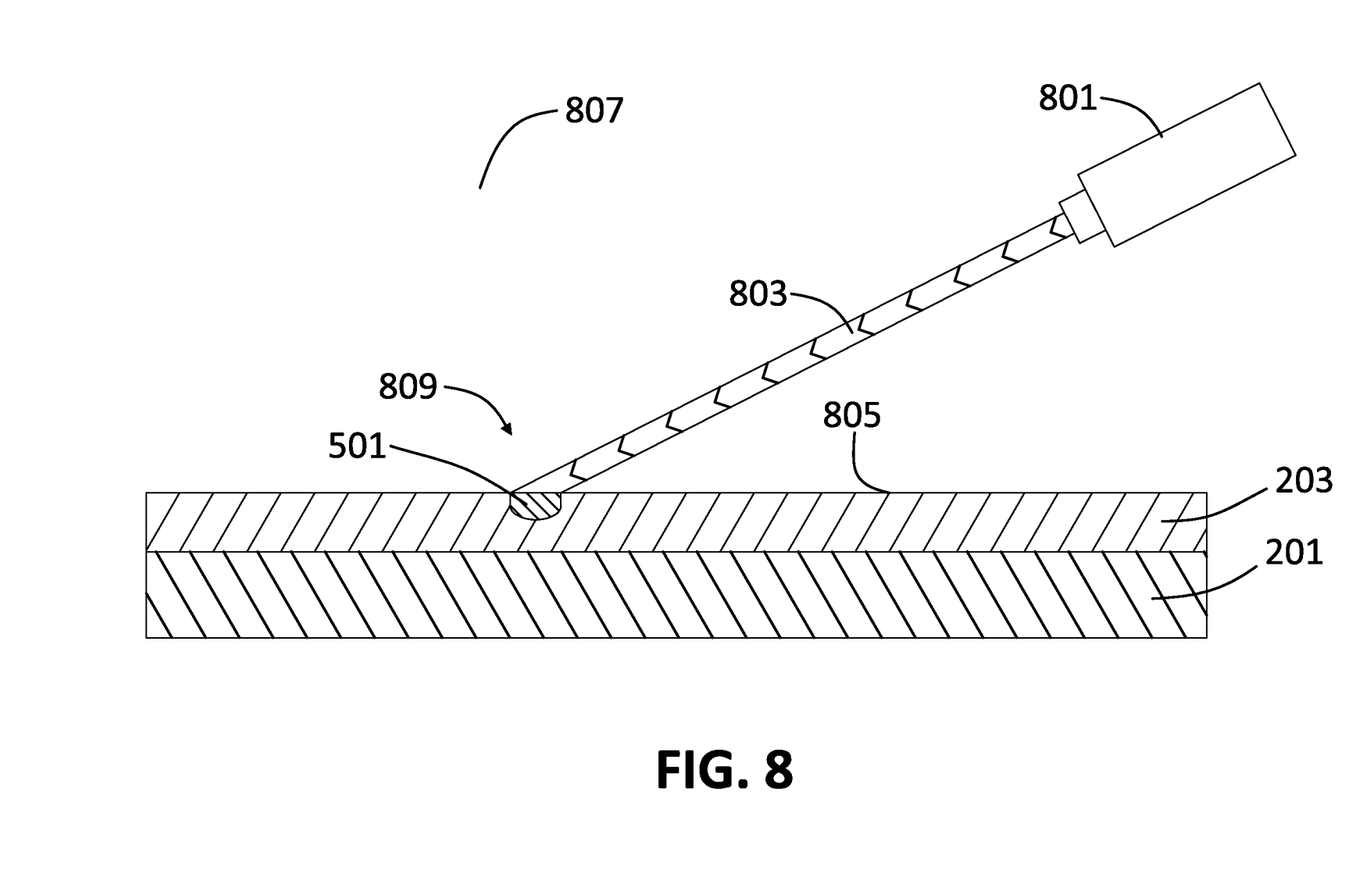
FIG. 8 is an apparatus for forming a reduced conductive area according to the disclosure.

FIG. 8 illustrates an apparatus for forming the reduced conductive area 501 as shown and described in FIG. 7. As shown in FIG. 8, an energy source 801 emits concentrated electromagnetic energy 803 that is directed at surface 805 of first conductive layer 203. The energy source 801 may be an energy source capable of providing sufficient heat to the surface 805 of the first conductive layer 203 to at least partially reduce the first conductive layer 203. The process is accomplished in a chamber 807 that is capable of providing a reducing atmosphere 809 at the surface 805. When concentrated electromagnetic energy 803 contacts the surface 805 in the presence of the reducing atmosphere, the first conductive layer 203 is at least partially reduced to form a reduced conductive area 501. In one embodiment, the reduced conductive area 501 is metallic. In certain embodiments, the reduced conductive area 501 is at least partially opaque. In these embodiments, the positioning of the reduced conductive area 501 is such that the opacity is in areas that do in impede sunlight and/or does not substantially affect the operation of the module 100.

Figure 9:
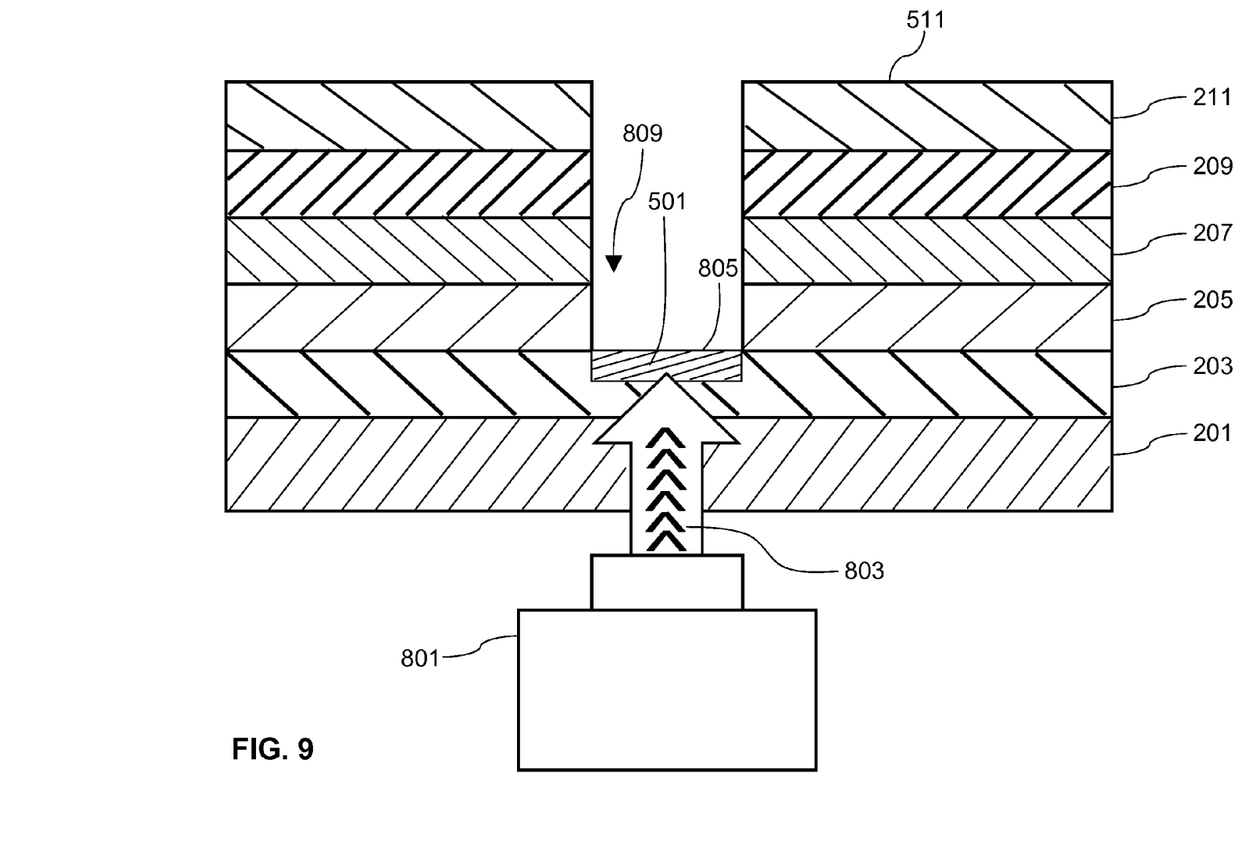
FIG. 9 is an apparatus for forming a reduced conductive area in a PV cell according to the disclosure.

FIG. 9 shows another embodiment, wherein a reduced conductive area 501 is formed when the second scribe 505 is being formed (box 609 of FIG. 6). In this embodiment, the energy source 801 includes concentrated electromagnetic energy 803, such as a laser beam, that is directed through superstrate 201, wherein the first portion 511 of first conductive layer 203, buffer layer 205, the first semiconductor layer 207, second semiconductor layer 209 and second conductive layer 211 are selectively removed. Concentrated electromagnetic energy 803 provides heat to surface 805 of first conductive layer 203. In addition, a reducing atmosphere 809 is provided to surface 805, resulting in formation of reduced conductive area 501 on first conductive layer 203.

While the above has been described with respect to photovoltaic modules and photovoltaic devices, the method, thin film structure and apparatus of the present disclosure are usable with other thin film devices. Other thin film devices usable with the present disclosure include, but are not limited to photo detectors, diode application, or thin film displays.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for forming a chemically reduced conductive area in a transparent conductive layer of a thin film photovoltaic device, the method comprising:
    providing a superstrate having a first conductive layer thereon, wherein the first conductive layer comprises a transparent conductive oxide material;
    depositing a first semiconductor layer on the first conductive layer;
    depositing a second semiconductor layer on the first semiconductor layer;
    forming a first scribe by selectively removing the first conductive layer, the first semiconductor layer, and the second semiconductor layer;
    filling the first scribe with a dielectric material;
    thereafter, exposing the superstrate to a reducing atmosphere;
    in the reducing atmosphere, directing concentrated electromagnetic energy from an energy source toward the superstrate to form a second scribe having a chemically reduced conductive area defined in the first conductive layer, wherein the chemically reduced conductive area has greater electrical conductivity than the transparent conductive oxide material; and
    thereafter, forming a second conductive layer on the second semiconductor layer and the chemically reduced conductive area.

2. The method of claim 1, wherein the transparent conductive oxide material is selected from the group consisting of $SnO_2$, $In_2O_3$, $Cd_2SnO_4$, $ZnO$, and combinations thereof.

3. The method of claim 1, wherein the transparent conductive oxide material comprises a cadmium tin oxide.

4. The method of claim 1, wherein the reducing atmosphere includes a gas selected from the group consisting of hydrogen, carbon monoxide, reforming gas and combinations thereof.

5. The method of claim 1, wherein providing the reducing atmosphere further comprises providing a gas additive.

6. The method of claim 5, wherein the gas additive is an organometallic gas.

7. The method of claim 6, wherein the organometallic gas is selected from the group consisting of tin tetrachloride, dimethyl cadmium, dimethyl zinc, and combinations thereof.

8. The method of claim 1, wherein the reducing atmosphere comprises hydrogen.

9. The method of claim 8, wherein the reducing atmosphere further comprises an organometallic gas.

10. The method of claim 8, wherein the reducing atmosphere further comprises tin tetrachloride.

11. The method of claim 8, wherein the reducing atmosphere further comprises dimethyl cadmium.

12. The method of claim 8, wherein the reducing atmosphere further comprises dimethyl zinc.

13. The method as in claim 1, further comprising:
    after filling the first scribe with the dielectric material and prior to exposing the superstrate to the reducing atmosphere, depositing a first portion of the second conductive layer over the second semiconductor layer and the dielectric material in the first scribe.

14. The method as in claim 13, wherein the first portion of the second conductive layer comprises graphite.

\* \* \* \* \*